United States Patent [19]

Danstrom

[11] Patent Number: 5,760,615

[45] Date of Patent: Jun. 2, 1998

[54] ZERO CURRENT ENABLE CIRCUIT

[75] Inventor: Eric J. Danstrom, Farmington Hills, Mich.

[73] Assignee: SGS-Thomson Microelectronics, Inc., Carrollton, Tex.

[21] Appl. No.: 658,448

[22] Filed: Jun. 5, 1996

Related U.S. Application Data

[63] Continuation of Ser. No. 282,728, Jul. 29, 1994, abandoned.

[51] Int. Cl.$^6$ ............................................. H03K 5/22
[52] U.S. Cl. ........................ 327/89; 327/77; 327/88; 327/544
[58] Field of Search ........................... 327/74, 75, 76, 327/77, 538, 539, 544, 547, 88, 89

[56] References Cited

U.S. PATENT DOCUMENTS

| | | | |
|---|---|---|---|
| 4,388,706 | 6/1983 | Butler | 327/544 |
| 4,625,129 | 11/1986 | Ueno | 327/544 |
| 4,994,691 | 2/1991 | Naghshineh | 327/540 |
| 5,013,934 | 5/1991 | Hobrecht et al. | 327/539 |
| 5,034,635 | 7/1991 | Ten Eyck | 327/539 |
| 5,039,881 | 8/1991 | Ooms et al. | 327/544 |
| 5,138,196 | 8/1992 | Satou et al. | 327/544 |

OTHER PUBLICATIONS

SGS–Thomson Microelectronics, L4939 Data Sheet and Circuit Diagram, Dual Multifunction 5V Voltage Regulator Aug. 1992.

"A Simple Three–Terminal IC Bandgap Reference", Brokaw, IEEE Journal, vol. SC–9, pp. 388–393 Dec. 1974.

"Bipolar and MOS Analog Integrated Circuit Design", Grebene, pp. 351–369, 1984.

*Primary Examiner*—Timothy P. Callahan
*Assistant Examiner*—Kenneth B. Wells
*Attorney, Agent, or Firm*—David V. Carlson; Theodore E. Galanthay; Lisa K. Jorgenson

[57] ABSTRACT

A zero current enable circuit and zero current enable method are disclosed. The integrated circuit features at least one sense circuit and a logic gate. The sensing circuit combines a broken band gap reference voltage, a voltage divider, a voltage clamp, a comparator, and a logic gate to generate an enable signal.

19 Claims, 2 Drawing Sheets

ZERO CURRENT ENABLE CIRCUIT

This application is a continuation of application Ser. No. 08/282,728, filed Jul. 29, 1994 and now abandoned.

BACKGROUND OF THE INVENTION

1. Field of the Invention

This invention relates to electronic circuits used to compare various input signals and generate an enable output signal. More particularly, this invention relates to enable circuits in integrated circuits which draw approximately zero current unless the enabling conditions exist.

2. Description of the Relevant Art

The problem addressed by this invention is encountered in the automobile industry where automobile engines are controlled by sophisticated process controllers. These controllers must operate in the harsh environment of an automobile which experiences wide fluctuations in temperature and voltages. Automobile performance requirements have increased with tighter government emission requirements and fuel economy regulations, while customer expectations have required increased reliability. Further, automobile manufacturers have responded to the increasing demands by using more microcomputers and electronics. Consequently, automobile manufacturers are requiring electronics manufacturers to provide smaller packages, higher degrees of integration, lower power consumption, and higher reliability while demanding lower costs.

FIG. 1 shows a typical prior art enable circuit for generating an enable signal in an automotive application. This enable circuit 5 generates an enable signal 19 when either the IGN signal 17 or EN2 signal 14 exceed the band gap reference voltage 10. Voltage regulator 2 converts a battery voltage 4 into a Vcc voltage 6. The band gap circuit 8 uses the Vcc voltage 6 to generate a band gap reference voltage 10. Comparator 12 compares the band gap reference voltage 10 to an EN2 signal 14 while comparator 16 compares band gap reference voltage 10 to IGN signal 17. The output of comparators 12 and 16 are logically ORed at logic gate 18. The output of logic gate 18 is the enable signal 19.

A limitation of this prior art circuit is that the circuit draws significant current even when signals EN2 14 and IGN 17 are low and the subsequent enable signal 19 is low. In this condition, the voltage regulator 2 draws approximately 150 microamps, the band gap circuit draws approximately 150 microamps, and comparators 12 and 16 each draw approximately 100 microamps. Consequently, the prior art circuit in FIG. 1 draws about 500 microamps of current even when the automobile is turned off (i.e. when the ignition switch signal IGN is low). As automobiles incorporate more and more on-board electronics, the need to conserve battery power increases.

This constant draw of current also means that the voltage regulator 2, band gap circuit 8, and comparators 12 and 16 are always on. By being on all the time, the life of the circuit is shortened and reliability is decreased.

SUMMARY OF THE INVENTION

In light of the above, therefore, it is an object of the invention to minimize power consumption.

It is still another object of the invention to use fewer transistors then prior art circuits.

It is yet another object of the invention to increase the reliability of the enable circuit by decreasing its power consumption and by decreasing its component count.

It is yet another object of the invention to provide an enable circuit which is thermally stable.

These and other object, features, and advantages of the invention will be apparent to those skilled in the art from the following detailed description of the invention, when read with the drawings and appended claims.

The invention can be summarized as an enable circuit which draws a near zero current when the output of the enable circuit is low. The enable circuit features at least one sense circuit and a logic gate. The sensing circuit combines a broken band gap reference voltage, a voltage divider, a voltage clamp, a comparator, and a logic gate to generate an enable signal.

DETAILED DESCRIPTION OF THE PREFERRED EMBODIMENT

Figure 1:
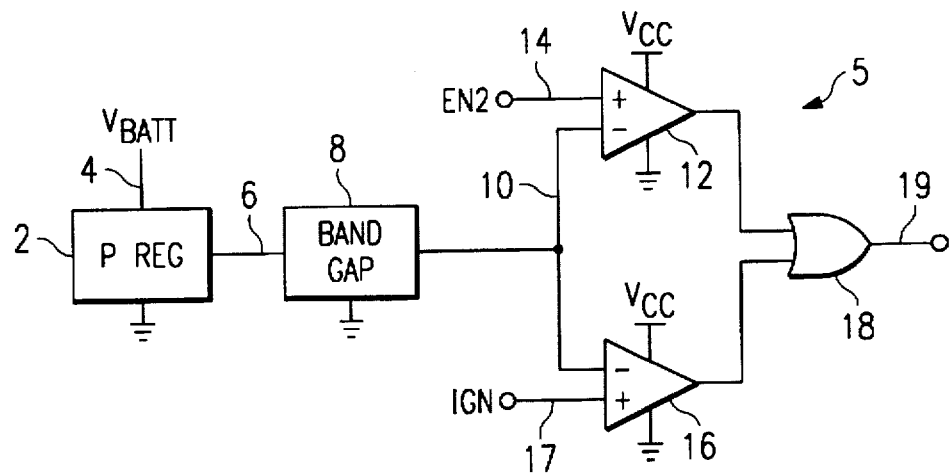
FIG. 1 is an electrical schematic diagram of an enable circuit, in accordance with the prior art.
Figure 2:
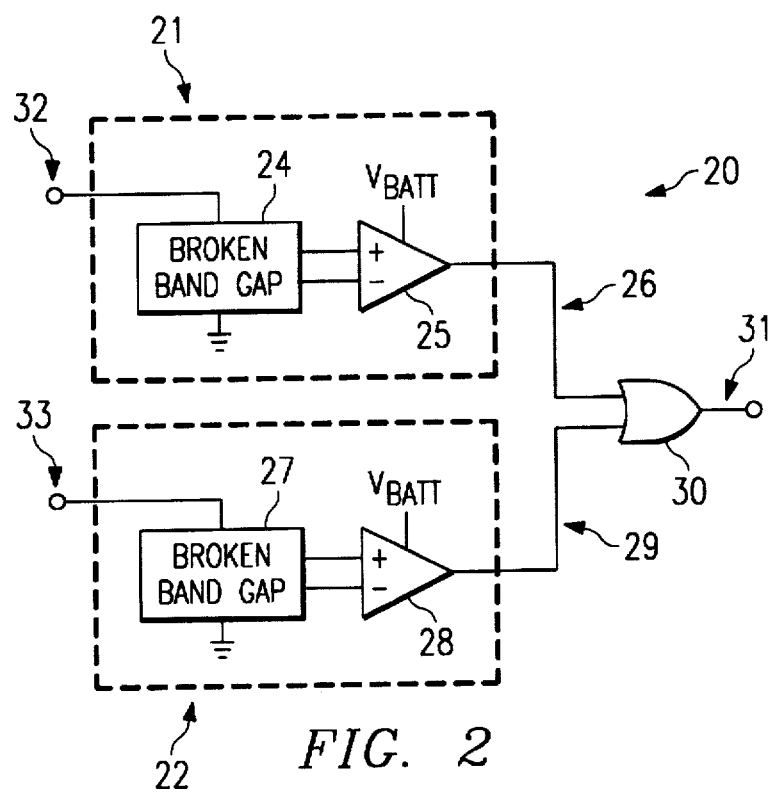
FIG. 2 is an electrical schematic diagram of a zero current enable circuit, in accordance with an embodiment of the present invention.

With reference now to FIG. 2, a zero current enable circuit 20 according to the preferred embodiment of the invention will now be described. The zero current enable circuit 20 includes a first sense circuit 21, a second sense circuit 22 and a NOR gate element 30. The first sense circuit 21 includes a broken band gap circuit 24 and a comparator 25. Similarly, the second sense circuit 22 includes a broken band gap circuit 27 and a comparator 28. A first input signal line 32, typically the IGNITION signal, is received at the input of the broken band gap circuit 24. The outputs of the broken band gap circuit 24 are connected to both of the inputs of comparator 25. The output of comparator 25 is connected to the first input of logic element 30. Similarly, a second input signal 33, typically the EN2 from a microprocessor, is connected to the input of the broken band gap circuit 27. The outputs of the broken band gap circuit 27 are connected to the inputs of comparator 28. The output of comparator 28 is connected to the second input of logic gate 30, which is a NOR gate. Although only two sense elements are disclosed, it is understood that more than two sense elements can be used without departing from the spirit of the invention.

In operation, sense circuit 21 monitors the first input signal 32. When the first input signal 32 is below approximately 0.7 volts, the broken band gap circuit 24, the comparator 25, and the NOR gate 30 draw approximately zero current since all the transistors in the circuits are off. When the input voltage 32 rises above 0.7 volts, the broken band gap circuit 24 and comparator 25 begin to draw current. When the first input signal 32 exceeds a threshold value of the broken bandgap circuit of approximately 1.2 volts, the output voltages going to comparator 25 switch such that comparator 25 generates an output signal 26 into the input of NOR gate 30, which thereby generates an enable signal 31 at the output of the NOR gate 30. Sense circuit 21 is advantageous over the prior art since it draws approximately zero current when the input signal 32 is below 0.7 volts.

Similarly, sense circuit 22 monitors the second input signal 33. When the first input signal 33 is below approximately 0.7 volts, the broken band gap circuit 27, the comparator 28, and the NOR gate 30 draw approximately zero current since all the transistors in the circuits are off. When the input voltage 33 rises above 0.7 volts, the broken band gap circuit 27 and comparator 28 begin to draw current. When signal 33 exceeds a threshold value of the broken band gap circuit of around 1.2 volts, comparator 28 generates an output signal 29 into the second input of NOR gate 30, which thereby generates an enable signal 31 at the output of the NOR gate 30. Until input signal 33 exceeds the threshold value, near zero current is drawn by sense circuit 22 or NOR gate 30.

Since sense circuit 21, sense circuit 22, and NOR gate 30 draw approximately zero current until an enable signal is generated, no power is consumed unless an enable signal is generated. Therefore power consumption is minimized and battery power is saved during the non-enabled periods of time. Additionally, the reliability of the circuit is increased since the lower power consumption decreases the average operating temperature which prolongs the life of the circuit.

Figure 3:
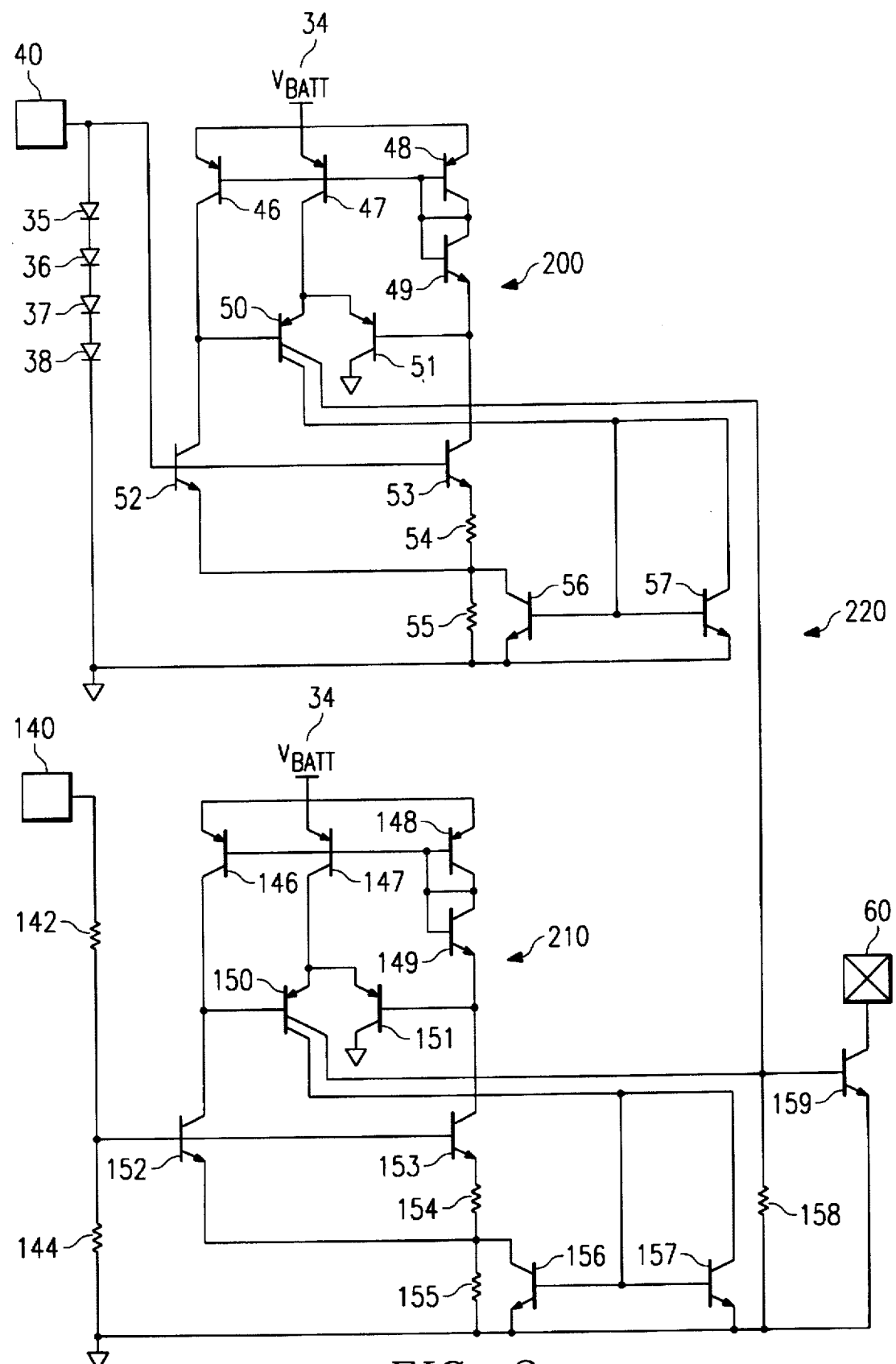
FIG. 3 is an electrical schematic diagram of a zero current enable circuit, in accordance with another embodiment of the present invention.

FIG. 3 shows in detail the preferred embodiment of FIG. 2. This zero current enable circuit 220 includes a first sense circuit 200, a second sense circuit 210, and a transistor 159 (which functions as a NOR gate). In this embodiment, the sense circuits 21 and 22 in FIG. 2 correspond to the sense circuits 200 and 210 but the comparators and bandgap voltage references of each sense circuit in FIG. 2 are combined into broken bandgap circuits. These broken bandgap circuits provide the benefit of good thermal stability, low power demand, and low transistor count.

FIG. 3 shows the first input 40 connected to the anode of diode 35, the transistor 52 base, and the transistor 53 base. The diode 35 is connected in a series with diodes 36, 37, and 38 anode to cathode where the diodes are all forward biased and the cathode of diode 38 is connected to ground. The emitters of PNP transistor 46, PNP transistor 47, and PNP transistor 48 are connected to a battery voltage 34. The bases of transistors 46, 47, and 48 are connected together and to the base of NPN transistor 49 and to the collectors of transistors 48 and 49. The emitter of transistor 49 is connected to the base of PNP transistor 51 and to the collector of NPN transistor 53. The collector of transistor 47 is connected to the emitters of PNP transistors 50 and 51. The collector of transistor 51 is connected to ground. The base of transistor 50 is connected to the collector of transistors 46 and 52. The emitter of transistor 53 is connected to one end of resistor 54. The other end of resistor 54 is connected to one end of resistor 55, the emitter of NPN transistor 52 and the collector to transistor 56. The other end to resistor 55 is connected to ground. The emitters of NPN transistors 56 and 57 are connected to ground.

Transistor 50 has two collectors where the first collector passes 25% of the total current while the second collector passes 75% of the total current. The first collector is connected to the base of transistor 56 and to the base and collector of transistor 57. The second collector is connected to the base of transistor 159 and to one end of resistor 158. The other end of resistor 158 is connected to ground. The emitter of transistor 159 is connected to ground. The collector of transistor 159 is connected to the enable pin 60.

Diodes 35, 36, 37, and 38 form a voltage clamp circuit. The bandgap voltage reference 24 of FIG. 2 is formed by transistor 52, transistor 53, resistor 54 and resistor 55. The comparator 25 of FIG. 2 is formed by transistors 46, 47, 48, 49, 50, 51, 52, and 53. Transistors 56 and 57 provide hysteresis for the comparator. This preferred embodiment provides thermal stability and has a threshold voltage of approximately 1.2 volts.

In operation, the first input voltage (typically the IGN input signal) enters the circuit through pin 40 and is distributed to the base of transistor 52. If the first input voltage exceeds approximately 2.8 volts, the clamping diodes 35, 36, 37, and 38 become forward biased thereby preventing the first input voltage from overdriving transistors 52 and 53.

When the first input signal is below approximately 0.7 volts, the broken band gap circuit 24, the comparator 25, and the NOR gate 30 draw approximately zero current since all the transistors in the circuits are off. When the input voltage 32 rises above 0.7 volts, the broken band gap circuit 24 and comparator 25 begin to draw current.

Transistors 52 and 53 and resistors 54 and 55 form the broken bandgap circuit which in effect is a voltage reference combined with a comparator. The trip point voltage of the broken bandgap circuit is given by the equation:

$$V_{(trip\ point)} = V_{be(transistor\ 52)} + 2(R55)/(R54)V_t \ln(A_{Q53}/A_{Q52})$$

where $V_{be(transistor\ 52)}$ = to the base to emitter voltage of transistor 52

(R55)/(R54) = resistor 55 divided by resistor 54

$V_t$ = the thermal voltage = 26 millivolts at room temp.

$\ln(A_{Q53}/A_{Q52})$ = the natural log of the ratio of the transistor areas of transistor 53 and transistor 52.

In the preferred embodiment, resistor 55 is 10,000 ohms, resistor 54 is 2,116 ohms, and the ratio of area between transistor 52 and 53 is 10. Therefore, the trip point voltage for the broken bandgap circuit is approximately 1.25 volts.

When the first input signal is below approximately 0.7 volts, transistors 52 and 53 are off and therefore transistors 46, 47, 48, 49, 50, 51 56, 57, and 159 are also off. Consequently, sense circuit 200 draws approximately zero current since all the transistors in the circuit are off. When the input voltage 32 rises above 0.7 volts, the broken band gap circuit 24 and comparator 25 begin to draw current.

When the first input voltage is above a turn-on voltage of transistor 53 but below the trip point voltage, transistor 53 is on and transistor 52 is substantially off. Consequently, transistors 48, 49, and 51 are on. The current through transistor 47 flows through transistor 51 to ground. Transistor 159 is off since it has no base current. In this state, almost zero current is drawn from the circuit. Therefore, this circuit provides the advantage of minimizing power consumption. Consequently reliability is enhanced.

When the scaled voltage is above the trip point voltage, transistor 53 is substantially off and transistor 52 is on. This turns on transistors 46, 47, 50, 57 and 159. Since transistor 159 is on, the voltage at output pin 60 is driven low thereby providing an enabling signal as the output to the circuit. Additionally, the conducting transistor 57 turns on transistor 56 which lowers the trip point of the broken bandgap circuit which gives the circuit hysteresis.

FIG. 3 also shows sense circuit 210 which operates in a similar manner as sense circuit 200. A second input signal 140 (typically the EN2 signal) is received by resistor 142 (25 kilo-ohms). On the other end, resistor 142 is connected to resistor 144 (having a value, for example, of 25 kilo-ohms), the NPN transistor 152 base, and the NPN transistor 153 base. The other end of resistor 144 is connected to ground. The battery voltage 34 is connected to the emitters of PNP transistor 146, PNP transistor 147, and PNP transistor 148. The bases of transistors 146, 147, and 148 are connected together and to the base of NPN transistor 149 and to the collectors of transistors 148 and 149. The emitter of transistor 149 is connected to the base of transistor 151 and the collector of transistor 153. The collector to transistor 147 is connected to the emitters of PNP transistors 150 and 151. The collector to transistor 151 is connected to ground. The base of transistor 150 is connected to the collector of transistors 146 and 152. The emitter of transistor 153 is connected to one end of resistor 154. The other end of resistor 154 is connected to one end of resistor 155, the emitter of transistor 152 and the collector to transistor 156. The other end to resistor 155 is connected to ground. The emitters of NPN transistors 156 and 157 are connected to ground. Transistor 150 has two collectors where the first collector passes 25% of the total current while the second collector passes 75% of the total current. The first collector is connected to the base of transistor 156 and to the base and collector of transistor 157. The second collector is connected to the base of NPN transistor 159 and to one end of resistor 158. The other end of resistor 158 is connected to ground. The emitter of transistor 159 is connected to ground. The collector of transistor 159 is connected to the enable pin 60.

Resistors 142 and 144 form a voltage scaling circuit. The broken bandgap voltage reference 27 of FIG. 2 is formed by transistor 152, transistor 153, resistor 154 and resistor 155. The comparator 28 of FIG. 2 is formed by transistors 146, 147, 148, 149, 150, 151, 152, and 153. Transistors 156 and 157 provide hysteresis for the comparator.

In operation, the second input signal enters the circuit through pin 140 and is distributed to resistor 142. The unregulated voltage is scaled with the voltage divider circuit formed by the 25,000 ohm resistor 142 and the 25,000 ohm resistor 144. Consequently, the scaled voltage is approximately half of the unscaled voltage.

Transistors 152 and 153 and resistors 154 and 155 form the broken bandgap circuit, which in effect is a voltage reference combined with a comparator. The trip point voltage of the broken bandgap circuit is given by the equation:

$$V_{(trip\ point)} = V_{be(transistor\ 152)} + 2(R155)/(R154)V_t \ln(A_{Q153}/A_{Q152})$$

where $V_{be(transistor\ 152)}$=to the base to emitter voltage of transistor 152

(R155)/(R154)=resistor 155 divided by resistor 154

$V_t$=the thermal voltage=26 millivolts at room temp.

ln $(A_{153}/A_{152})$=the natural log of the ratio of the transistor areas of transistor 153 and transistor 152.

In this sense circuit, resistor 155 is 10,000 ohms, resistor 154 is 2,116 ohms, and the ratio of area between transistor 153 and 152 is 10. Therefore, the trip point voltage for the broken bandgap circuit is approximately 1.2 volts.

When the second input signal is below approximately 0.7 volts, transistors 152 and 153 are off and therefore transistors 146, 147, 148, 149, 150, 151, 156, 157, and 159 are also off. Consequently, sense circuit 210 draws approximately zero current since all the transistors in the circuit are off. When the input voltage rises above 0.7 volts, the broken band gap circuit 27 and comparator 28 begin to draw current.

When the scaled voltage is below the trip point voltage, transistor 153 is on and transistor 152 is substantially off. Consequently, transistors 148, 149, and 151 are on. The current through transistor 147 flows through transistor 151 to ground. Transistor 159 is off since it has no base current. When the scaled voltage is above the trip point voltage, transistor 153 is substantially off and transistor 152 is on. This turns on transistors 146, 147, 150, 157 and 159. Since transistor 159 is on, the voltage at output pin 60 is driven low thereby generating an enable signal. Additionally, the conducting transistor 157 turns on transistor 156 which lowers the trip point of the broken bandgap circuit which gives the circuit hysteresis.

It is understood by persons of ordinary skill in the art that this embodiment can be formed as part of a single integrated circuit.

Since sense circuit 200, sense circuit 210, and transistor 159 draw approximately zero current until an enable signal is generated, no power is consumed unless an enable signal is generated. Therefore power consumption is minimized and battery power is saved during the non-enabled periods of time. Additionally, the reliability of the circuit is increased since the lower power consumption decreases the average operating temperature which prolongs the life of the circuit. Additionally, the broken bandgap circuits provide the benefit of good thermal stability, low power demand, and low transistor count.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as herein claimed.

We claim:

1. An integrated circuit for enabling electronic circuitry in an automobile, comprising:

a first sense circuit including a first broken bandgap reference voltage circuit and a first comparator having a first comparator input connected to a first transistor in the first broken bandgap reference voltage circuit and having a second comparator input connected to a second transistor in the first broken bandgap reference voltage circuit, the first sense circuit having an input coupled to the first broken bandgap reference circuit, the sense circuit input for receiving a first input signal, and having a first output signal, the first sense circuit drawing less than 250 microamps of current unless the first input signal exceeds a first threshold value;

a second sense circuit including a second broken bandgap reference voltage circuit and a second comparator having a first comparator input connected to a first transistor in the second broken bandgap reference voltage circuit and having a second comparator input connected to a second transistor in the second broken bandgap reference voltage circuit, the second sense circuit having a second sense circuit input for receiving a second input signal, and having a second output signal, the second sense circuit drawing less than 250 microamps of current unless the second input signal exceeds a second threshold value; and a logic element having a first input for receiving the first output signal, a second input for receiving the second output signal, and an output such that an electronic circuitry enabling signal is generated on the output of the logic element in response to states of the first output signal and the second output signal.

2. The integrated circuit of claim 1 wherein said logic element is a NOR gate.

3. The integrated circuit of claim 1 wherein said second sense circuit further comprises a voltage scaling circuit for scaling the second input signal of said second sense circuit.

4. The integrated circuit of claim 3 wherein said voltage scaling circuit comprises a voltage divider.

5. The integrated circuit of claim 1 wherein said first sense circuit further comprises a voltage clamp circuit for limiting the first input signal voltage.

6. In an integrated circuit, an electronic circuit for providing an enable signal comprising:

an input terminal for accepting an input signal;

a broken bandgap voltage reference circuit coupled to the input terminal, the bandgap voltage reference circuit for generating a sensing signal when the input signal exceeds a threshold value of a first level;

a comparator coupled to the broken bandgap voltage reference circuit by a first and second comparator input, the comparator for providing a threshold signal to a comparator output when the sensing signal exceeds a threshold value of a second level;

a second input terminal for accepting a second input signal;

a second broken bandgap circuit coupled to the second input terminal, the second broken bandgap circuit for generating a second sensing signal when the second input signal exceeds a threshold value of a third level;

a second comparator coupled to the broken bandgap reference circuit by a first and second comparator input, the comparator for providing a second threshold signal to a second comparator output when the second sensing signal exceeds a threshold value of a fourth level; and a logic element coupled to the comparator output and the second comparator output, the logic element for generating the enable signal in response to the comparator outputs;

wherein the electronic circuit draws less than 250 microamps of current unless the input signal exceeds the first level threshold value or the second input signal exceeds the third level threshold value.

7. The electronic circuit of claim 6 wherein the broken bandgap circuit shares common electronic circuitry with the comparator and wherein the second broken bandgap circuit shares common electronic circuitry with the second comparator.

8. The electronic circuit of claim 6 wherein the logic element is a NOR gate.

9. The electronic circuit of claim 6, further including a voltage clamping circuit for limiting the voltage of at least one of the input signals.

10. The electronic circuit of claim 6, further including a voltage scaling circuit for scaling at least one of the input signals.

11. The electronic circuit of claim 6, further including circuitry to lower the voltage level of the input signal needed to turn off the enable signal once enabled, and to raise the voltage level of the input signal needed to turn on the enable signal once disabled.

12. The electronic circuit of claim 6 wherein the threshold value of the first level equals the threshold value of the third value; and wherein the threshold value of the second level equals the threshold value of the fourth value.

13. In an integrated circuit, an electronic circuit for enabling electronic circuitry in an automobile by generating an enable signal, comprising:

an input terminal for accepting an input signal;

a broken bandgap voltage reference circuit coupled to the input terminal, the bandgap voltage reference circuit for generating a sensing signal when the input signal exceeds a threshold value of a first level;

a comparator coupled to the broken bandgap voltage reference circuit by a first and second comparator input, the comparator for providing a threshold signal to a comparator output when the sensing signal exceeds a threshold value of a second level;

a second input terminal for accepting a second input signal;

a second broken bandgap circuit coupled to the second input terminal, the second broken bandgap circuit for generating a second sensing signal when the second input signal exceeds a threshold value of a third level;

a second comparator coupled to the broken bandgap reference circuit by a first and second comparator input, the comparator for providing a second threshold signal to a second comparator output when the second sensing signal exceeds a threshold value of a fourth level; and a logic element coupled to the comparator output and the second comparator output, the logic element for generating the enable signal in response to the comparator outputs;

wherein the electronic circuit draws less than 250 microamps of current unless the input signal exceeds the first level threshold value or the second input signal exceeds the third level threshold value.

14. The electronic circuit of claim 13 wherein the broken bandgap circuit shares common electronic circuitry with the comparator and wherein the second broken bandgap circuit shares common electronic circuitry with the second comparator.

15. The electronic circuit of claim 13 wherein the logic element is a NOR gate.

16. The electronic circuit of claim 13, further including a voltage clamping circuit for limiting the voltage of at least one of the input signals.

17. The electronic circuit of claim 13, further including a voltage scaling circuit for scaling at least one of the input signals.

18. The electronic circuit of claim 13, further including circuitry to lower the voltage level of the second input signal needed to turn off the enable signal once enabled, and to raise the voltage level of the second input signal needed to turn on the enable signal once disabled.

19. The electronic circuit of claim 13 wherein the threshold value of the first level equals the threshold value of the third value; and wherein the threshold value of the second level equals the threshold value of the fourth value.

* * * * *